(12) United States Patent
Ruha et al.

(10) Patent No.: US 6,680,634 B1
(45) Date of Patent: Jan. 20, 2004

(54) SELF CALIBRATING DIGITAL DELAY-LOCKED LOOP

(75) Inventors: Antti Ruha, Oulu (FI); Joni Jäntti, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/308,825

(22) Filed: Dec. 3, 2002

(51) Int. Cl.$^7$ ................................................. H03L 7/06
(52) U.S. Cl. ....................................... 327/158; 327/149
(58) Field of Search ................................ 327/149, 152, 327/153, 158, 161, 276, 277, 284

(56) References Cited

U.S. PATENT DOCUMENTS

| | | | |
|---|---|---|---|
| 6,342,796 B2 * | 1/2002 | Jung ........................... | 327/141 |
| 6,388,480 B1 * | 5/2002 | Stubbs et al. ................ | 327/156 |
| 6,437,618 B2 * | 8/2002 | Lee ............................. | 327/158 |
| 6,483,360 B2 * | 11/2002 | Nakamura ................... | 327/158 |
| 6,580,299 B2 * | 6/2003 | Horan et al. ................. | 327/158 |

OTHER PUBLICATIONS

Chien et al., "A 900–MHz Local Oscillator Using a DLL–Based Frequency Multiplier Technique for PCS Applications", IEEE Journal of Solid–State Circuits, vol. 35, No. 12, Dec. 2000.

* cited by examiner

*Primary Examiner*—Timothy P. Callahan
*Assistant Examiner*—Cassandra Cox
(74) *Attorney, Agent, or Firm*—Harrington & Smith, LLP

(57) ABSTRACT

Disclosed is a method for calibrating a delay-locked loop containing a chain of delay line elements that propagate a reference clock from delay line element to delay line element. Also disclosed is a delay-locked loop that operates in accordance with the method. The method includes, during a calibration procedure, sequentially varying the configuration of the chain of delay line elements so that there is one unused delay line element and a plurality of used delay line elements and, for each configuration, electrically compensating at least one delay line element based on a phase comparison results obtained from previous calibration configurations of the delay line elements so as to set the total delay through the chain of delay line elements at a desired value. The phase comparison is made between the reference clock and the propagated reference clock. Varying the configuration of the chain of delay line elements is accomplished in the preferred embodiment by changing the start and end of the chain of delay line elements

28 Claims, 17 Drawing Sheets

BIAS

CASCADED SUB-ELEMENTS

PARALLEL

DIFFERENTIAL PAIR

| PHASE COMPARISON | | AVERAGING REGISTERS (AVERAGING FACTOR=2) 1 FROM pd => ADD 1; 0 FROM pd => SUBSTITUTE 1 | | | | | DAC COUNTERS ARE INCREMENTED OR DECREMENTED WHEN AVERAGING REGISTER OF THE UNUSED ELEMENT IN SATURATION | | | | |
|---|---|---|---|---|---|---|---|---|---|---|---|
| 1, LEADING | 0, LAGGING | E1 | E2 | E3 | E4 | E5 | E1 | E2 | E3 | E4 | E5 |
| INITIAL | | 0 | 0 | 0 | 0 | 0 | 25 | 25 | 25 | 25 | 25 |
| CASE A | 1 | 1 | 1 | 1 | 1 | 0 | 25 | 25 | 25 | 25 | 25 |
| CASE B | 0 | -1 | 0 | 0 | 0 | -1 | 25 | 25 | 25 | 25 | 25 |
| CASE C | 0 | 0 | 0 | -1 | -1 | -2 | 25 | 25 | 25 | 25 | 25 |
| CASE D | 0 | -1 | -1 | 0 | -2 | -3 | 25 | 25 | 25 | 25 | 25 |
| CASE E | 1 | 0 | 0 | -1 | -2 | -2 | 25 | 25 | 25 | 24 | 25 |
| CASE A | 1 | 1 | 1 | 1 | 1 | -2 | 25 | 25 | 25 | 25 | 24 |

UNUSED
AVERAGING REGISTER SATURATED
UPDATED

| CASE | IN | OUT | | ELEMENTS, WHICH ARE USED DELAY SIGNAL | | | | "IMMEDIATE CALIBRATION" ELEMENTS, WHICH ARE ADJUSTED AFTER PHASE DETECTION | | | | |
|------|----|----|----|----|----|----|----|----|----|----|----|----|
| A | E1 | E4 | | | | | E4 | E1 | E2 | E3 | E4 | |
| B | E2 | E5 | | | | E4 | E5 | E2 | E3 | E4 | E5 | |
| C | E3 | E1 | | | E3 | E4 | E5 | E1 | E3 | E4 | E5 | E1 |
| D | E4 | E2 | | E3 | E4 | E5 | E1 | E2 | E4 | E5 | E1 | E2 |
| E | E5 | E3 | | E4 | E5 | E1 | E2 | E3 | E5 | E1 | E2 | E3 |
| A | E1 | E4 | | E5 | E1 | E2 | E3 | E4 | E1 | E2 | E3 | E4 |
| B | E2 | E5 | | E1 | E2 | E3 | E4 | E5 | E2 | E3 | E4 | E5 |
| C | E3 | E1 | | E2 | E3 | E4 | E5 | E1 | E3 | E4 | E5 | E1 |
| D | E4 | E2 | | E3 | E4 | E5 | E1 | E2 | E4 | E5 | E1 | E2 |
| E | E5 | E3 | | E4 | E5 | E1 | E2 | E3 | E5 | E1 | E2 | E3 |
| A | E1 | E4 | | E5 | E1 | E2 | E3 | E4 | E1 | E2 | E3 | E4 |
| B | E2 | E5 | | E1 | E2 | E3 | E4 | E5 | E2 | E3 | E4 | E5 |
| C | E3 | E1 | | E2 | E3 | E4 | E5 | E1 | E3 | E4 | E5 | E1 |
| D | E4 | E2 | | E3 | E4 | E5 | E1 | E2 | E4 | E5 | E1 | E2 |
| E | E5 | E3 | | E4 | E5 | E1 | E2 | E3 | E5 | E1 | E2 | E3 |
| ... | | | | ... | ... | ... | ... | ... | ... | ... | ... | ... |

TO E4 IN FIG.11B

"CYCLIC CALIBRATION"

PHASE DETECTION RESULTS ARE STORED
TO INDIVIDUAL "MEMORY" ASN ADJUSTMENT IS
DONE AFTER ON FULL CYCLE

ELEMENT, WHICH IS ADJUSTED DURING THE CASE

E5
E1
E2
E3
E4
E5
E1
E2
E3
E4
E5
E1
E2
E3
E4 ...

FROM FIG.11A

FIG.11B

"AVERAGED CYCLIC CALIBRATION"

SAME AS CYCLIC, BUT ADJUSTMENT IS NOT DONE,
IF THERE IS NOT ENOUGH PHASE DETECTIONS
RESULTS IN MEMORY POINTING TO SAME DIRECTION

ELEMENT, WHICH IS ADJUSTED DURING THE CASE

SELF CALIBRATING DIGITAL DELAY-LOCKED LOOP

TECHNICAL FIELD

These teachings relate generally to clock frequency generators and, more specifically, relate to clock frequency generators that employ digital delay-locked loop (DLL) circuitry.

BACKGROUND

The evolution of radio frequency (RF) and baseband (BB) circuit architectures in wireless communication terminals and devices, and the increasing trend toward high levels of integration of these and related circuits (e.g., so-called "radio on a chip" architectures), is placing more challenging requirements on local clock generation and RF up and down frequency conversion. In general, however, these problems are shared by all electronic devices that require frequency multiplication and/or multi-phase clock generation.

The DLL overcomes certain problems typically found in the conventional phase-locked loop (PLL), such as stability and jitter problems related to accumulated jitter induced by the power supply and reference clock. In that the timing uncertainties occur only within the period of the reference clock (shown as $T_{REF}$ in FIG. 1B), the DLL is capable of generating multi-phase clock signals that exhibit very low jitter. Additionally, DLLs are first order systems, which provides some advantages as compared to higher order PLLs, e.g., DLLs are more stable and do not require large off-chip components, such as capacitors, to implement the second order loop filter.

FIG. 1A illustrates the conventional structure of a DLL (see, for example, Chien G. & Gray P. R. (2000) A 900-MHz Local Oscillator Using a DLL-Based Frequency Multiplier Technique for PCS Applications. IEEE Journal of Solid-State Circuits, vol. 35, pgs. 1996–1999). The basic DLL 1 contains an adjustable delay line 2, a feedback loop 3 and a clock edge combiner, more simply an edge combiner 4. A reference clock generator 5 feeds a reference clock signal $R_{REF}$ to a first element of the delay line 2, and the output of the last element of the delay line 2 is fed to a phase detector of the feedback loop 3. The feedback loop 3 compares the phase difference of the output of the last delay line element to the reference clock and adjusts the delay line 2 to lock-on to reference clock signal. When the loop is locked, the total delay of the delay line 2 is equal to the period of the reference clock signal. The implementation of the feedback loop 3 can be analog or digital. The function of the edge combiner 4, which receives inputs from the outputs of individual ones of the delay line elements, is to decode the outputs of the delay line elements to generate the output clock signal $F_{OUT}$. The operation of the clock edge combiner 4 is shown in FIG. 1B (see again, for example, G. Chien et al., supra).

One basic shortcoming of the conventional DLL 1 is that it suffers from problems caused by a mismatch between the elements of the delay line 2. For example, an integrated circuit (IC) implementation can result in the existence of small differences between the elements. This mismatch can result in a periodic jitter on the output clock signal $F_{OUT}$, and thus generates undesirable spurious tones in the output signal. A most disadvantageous spurious tone occurs at a frequency that is offset by (plus and minus) $F_{ref}$ from the output frequency $F_{OUT}$, as shown in the exemplary spectrum of FIG. 2, which shows the spectrum of a three times multiplied clock and assumes a 10% delay line element mismatch. The spurious tones that occurs at a frequency that is $F_{ref}$ away from the output frequency $F_{OUT}$ may fall within the signal band of interest, and thus represent an internally generated noise source.

Prior approaches to correcting this problem include attempting to match the elements of the delay line 2 as closely as possible, which adds cost, and selecting the ratio of the reference frequency and output frequency so that the generated spurious tones are not located in the signal band of interest, which adds complexity and places constraints on circuit operational parameters.

It should be noted that although much effort can be expended on designing and fabricating identical delay line elements, there is always some residual mismatch due to IC process variations and gradients.

SUMMARY OF THE PREFERRED EMBODIMENTS

The foregoing and other problems are overcome, and other advantages are realized, in accordance with the presently preferred embodiments of these teachings.

In accordance with this invention the delay of the entire delay loop is calibrated with a main digital adjustment that affects all of the delay elements, in combination with individual digital adjustment that is used to calibrate the delays of each individual delay element.

In accordance with an aspect of this invention, a solution to the mismatch problem is to provide the delay line with an additional delay element. The delay line calibration is performed by circulating the starting and ending point of the delay line, and individually adjusting the delays of the individual delay elements. After being calibrated the delay line has delay elements with (ideally) identical unit delay, and spurious tones can thus be eliminated.

The inventors have realized that this technique is most optimally applied to the case where a division is made between a common, main calibration component and a plurality of fine, individual calibration components, and by the use of digital control techniques and digital storage of the control quantity used with a cyclically operated delay line. This is true at least for the reason that implementing this type of calibration with an analog feedback loop is not the most optimum approach, as the delay adjustment procedure requires implementing, for each delay line element, a relatively large capacitor to store a local bias voltage.

In the preferred embodiment of this invention a DLL calibration architecture with multilevel digital delay control is provided. In a presently preferred, but non-limiting embodiment each delay element is provided with a digital to analog converter (DAC), referred to as a fine adjustment DAC, or more simple as a fine DAC, that functions to adjust the differences between delay line elements. The entire delay line is forced to lock-on to the reference clock using a main DAC having an output that is input as a common bias signal to all of the delay line elements.

Calibration can be continuous during operation of the delay line or loop, or it may occur only during predetermined calibration periods.

This invention aids in eliminating spurious tones and deterministic jitter in clock signals generated by the DLL, thereby improving the operation of, for example, ADC sampling and RF-up-conversion and down-conversion circuitry.

Disclosed is a method for operating and calibrating a delay-locked loop containing a chain of delay line elements that propagate a reference clock from delay line element to delay line element. Also disclosed is a delay-locked loop that operates in accordance with the method. The method includes, during a calibration procedure, sequentially varying the configuration of the chain of delay line elements so that there is one unused delay line element and a plurality of used delay line elements and, for each configuration, electrically compensating at least one delay line element based on a phase comparison results obtained from previous calibration configurations of the delay line elements so as to set the total delay through the chain of delay line elements at a desired value. The phase comparison is made between the reference clock and the propagated reference clock. Varying the configuration of the chain of delay line elements is accomplished in the preferred embodiment by changing the start and end of the chain of delay line elements.

In one embodiment the step of electrically compensating is an immediate compensation that occurs after each phase comparison and electrically compensates all of the used delay line elements. In another embodiment the step of electrically compensating is a cyclic compensation that occurs after each phase comparison, and that electrically compensates the currently unused delay line element that was used in a plurality of previous configurations. In another embodiment the step of electrically compensating is an averaged cyclic compensation technique that occurs after a plurality of phase comparisons, and that electrically compensates the currently unused delay line element based on a history obtained over a plurality of previous configurations.

Electrically compensating may include one or more of varying a bias voltage to an active element of at least one delay line element, and electrically configuring at least one delay element.

Electrically configuring can include one or more of varying a number of cascaded delay element sub-elements and varying a number of paralleled delay element sub-elements. Electrically configuring can also involve varying a load capacitance seen by at least one delay element.

Varying the bias voltage preferably entails setting the inputs to a plurality of DACs, including a main DAC that outputs a common bias signal to all of the delay line elements, and a fine DAC that outputs a bias signal to only one delay line element.

The method further includes detecting a false delay line lock condition, and in response adjusts the delay to achieve a true delay line lock. In this case circuitry operates to determine that the delay line element outputs appear in a desired order and occur within one period of the reference clock.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 7A shows the basic output waveform with overlapped outputs from the delay line elements of FIG. 4, FIG. 7B shows a multiplied version of the reference frequency signal, and FIG. 7C shows non-overlapped outputs from the delay line elements;

FIGS. 8A through 8C show three principal methods for implementing adjustable delay elements, while FIG. 8A illustrates an embodiment of a delay line element constructed with transistors connected as an inverter, and the application of the outputs of the main and fine DACs as a bias signal for electrically controlling the delay of a signal propagating through the inverter, FIG. 8B shows the delay line elements in a cascaded inverter embodiment, FIG. 8C shows the delay line elements in a paralleled inverter embodiment and FIG. 8D shows a delay line element that utilizes cascaded, parallel and bias adjustments, and may be used in the embodiment of FIG. 4;

FIGS. 10A and 10B are useful in explaining the propagation of the unused delay element and the phase detection process for various calibration cases; and FIGS. 11A, 11B and 11C show examples of an immediate calibration mode of operation, a cyclic calibration mode of operation and an averaged cyclic calibration mode of operation, respectively.

DETAILED DESCRIPTION OF THE PREFERRED EMBODIMENTS

Figure 4:
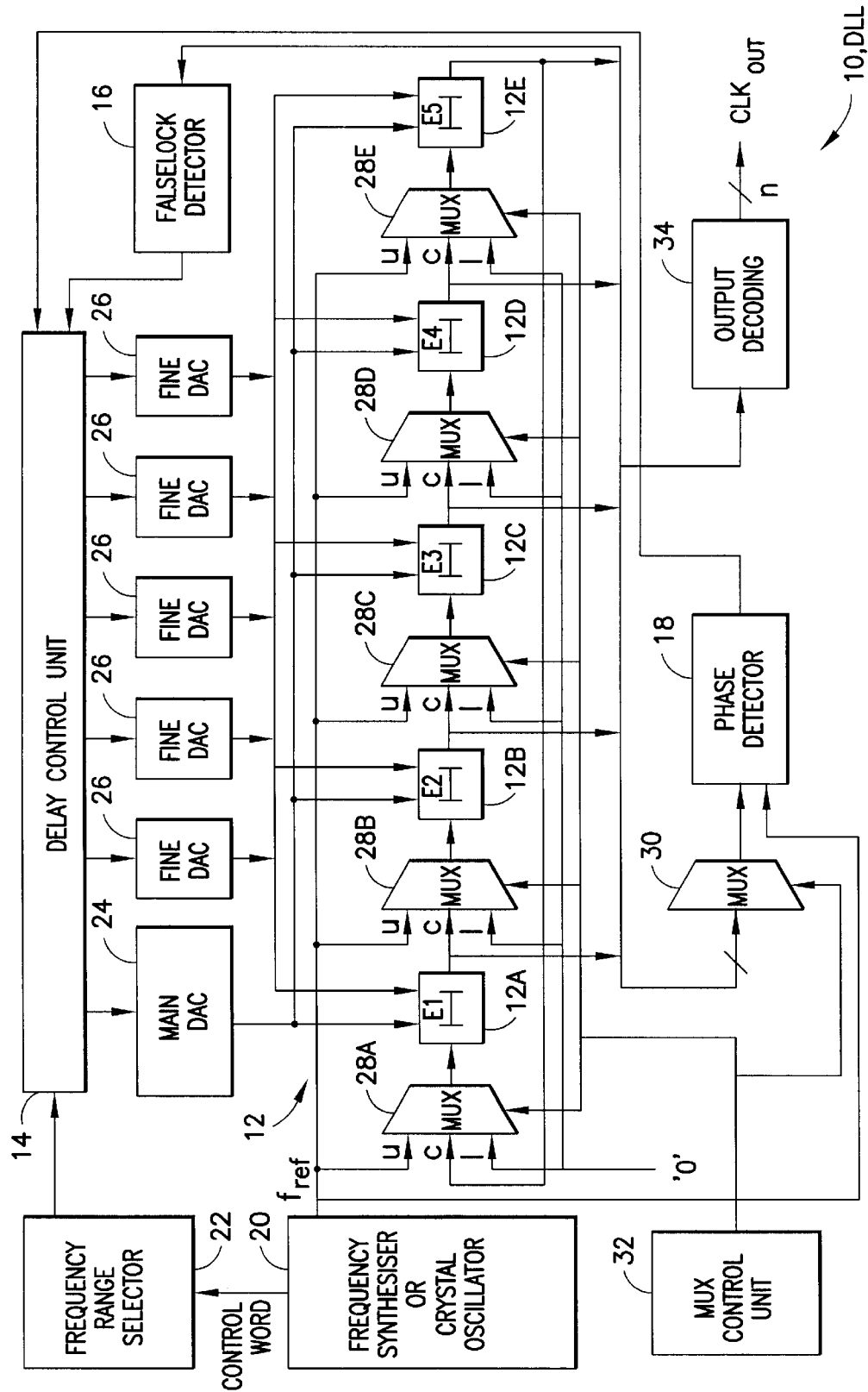
FIG. 4 is a block diagram of a self-calibrating digital DLL in accordance with this invention.

Referring to FIG. 4, this invention provides a DLL 10 with a calibration architecture that features multi-level digital delay control. During calibration the starting and ending point of a multi-element delay line 12 is circulated, and the phase information of each comparison of a delay element to a reference clock is analyzed. The adjustment may be performed only to a delay element that is not currently in use (during a cyclic calibration procedure or an averaged cyclic calibration procedure), and averaging may be used to stabilize the behavior in the locked state of the DLL 10, or the adjustment may be performed to a plurality of delay elements that are currently in use, during an immediate calibration procedure. These various calibration procedures are described below in greater detail.

The DLL 10 includes, in addition to the delay line 12 containing delay line elements 12A–12E, a delay control unit 14, a false lock detector 16, a phase detector 18, a reference frequency source 20, such as a frequency synthesizer or a crystal oscillator, that provides a reference frequency signal $f_{ref}$, a frequency range selector 22, a plurality of digital to analog converters (DACs), including a main DAC 24 and a plurality of fine DACs 26, a plurality of delay line multiplexers (MUXs) 28A–28E, an output MUX 30 that feeds the phase detector 18, a MUX control unit 32 and an output decoding block 34 that outputs a desired clock output signal $CLK_{OUT}$ on one or more (k) signal lines when a multi-phase clock is desired. The output decoding block 34 is capable of generating multiplied or multi-phase clock signals (see FIGS. 7A–7C).

MUXs 28A–28E each have three inputs, labeled for convenience as upper (u), center(c) and lower (l). The upper input is connected to $f_{ref}$, the center input to the output of the preceding MUX, except for MUX 28A which is connected to the output of the last delay element 12E, and the lower input is connected to a logic zero. The lower input is provided for the unused delay element. For example, when the signal propagates through E1–E4, then '0' is fed to E5, via the lower input of MUX 28E, so that the reference clock cycle does not propagate to E5. If the reference clock $f_{ref}$ signal is fed to delay element E1, the output of E4 is applied to the phase detector 18 via MUX 30, and so forth. This procedure is repeated until the reference clock $f_{ref}$ is fed in turn to each delay element 12.

For purposes of clarity, FIG. 4 shows only adjustments done with DACs 24 and 26. However, it should be realized that cascaded/parallel "wide-range" delay elements can be used with an appropriate control bit from the delay control unit 14. In general, the cascaded/parallel delay adjustment is functionally equivalent to the bias adjustment performed with DACs. That is, while the use of main and fine DACs is shown in FIG. 4, it should be appreciated that in general this invention provides other techniques for adjusting the delay of a delay line element 12, and that the DACS 24 and 26 are simply one non-limiting embodiment of main and fine delay calibration, respectively. This is made even more apparent in FIGS. 8B, 8C and 8D.

Briefly, phase comparison is implemented with the digital phase detector 18. The phase information from the delay elements 12A–12E are analyzed in the delay control unit 14, which includes averaging registers or counters and logic to process the phase information. The delay adjustment of the delay elements 12A is implemented, in this embodiment, with the DACs 24 and 26. The main DAC 24 drives the entire delay line 12 to lock to the reference clock $f_{ref}$. Additionally, each delay element 12A has an associated fine DAC 26 that is used to calibrate the delay elements 12A–12E (E1–E5). The structure of the fine DACs 26 can be designed to be simple, as the amount of the mismatch is typically only a few percent and thus a wide output range is not required. The delay elements 12A–12E are preferably implemented with inverters, which may be arranged in cascade (FIG. 8B) or in parallel (FIG. 8C), and the fine DACs 26 set the bias of the inverters according to a control word output from source 20. The current output from the DACs 24, 26 is used to set the bias current of the delay elements 12A–12E, and to thus set the drive capability of a delay element 12 to the capacitive load seen by the element. This defines the delay of the delay element 12. The actual bias current value depends on circuit design and the application. A suitable, non-limiting range of current values is from about one microamp to about 100 microamps.

The locking range and speed are expanded by the use of the false lock detector 16. The false lock detector 16 monitors the rising edges of the delay line signals, as described below in FIGS. 6A, 6B and 6C, to ensure that they occur in the correct order and in the correct amount of time (during the reference clock period $T_{REF}$). In the case of an occurrence of a false lock condition, the false lock detector 16, via its input to the delay control unit 14, changes the coarse adjustment so that the delay loop locks on to the correct edge sequence.

Figure 5A:
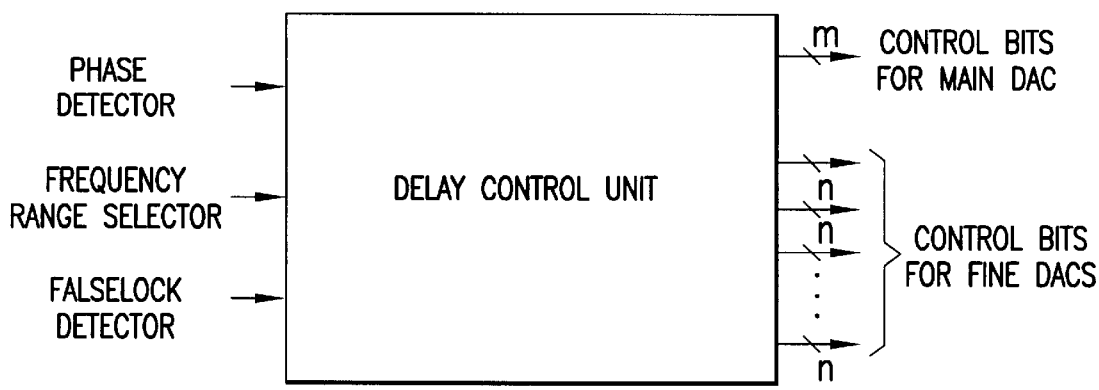
FIG. 5A shows the inputs and outputs of the delay control unit of FIG. 4.
Figure 5B:
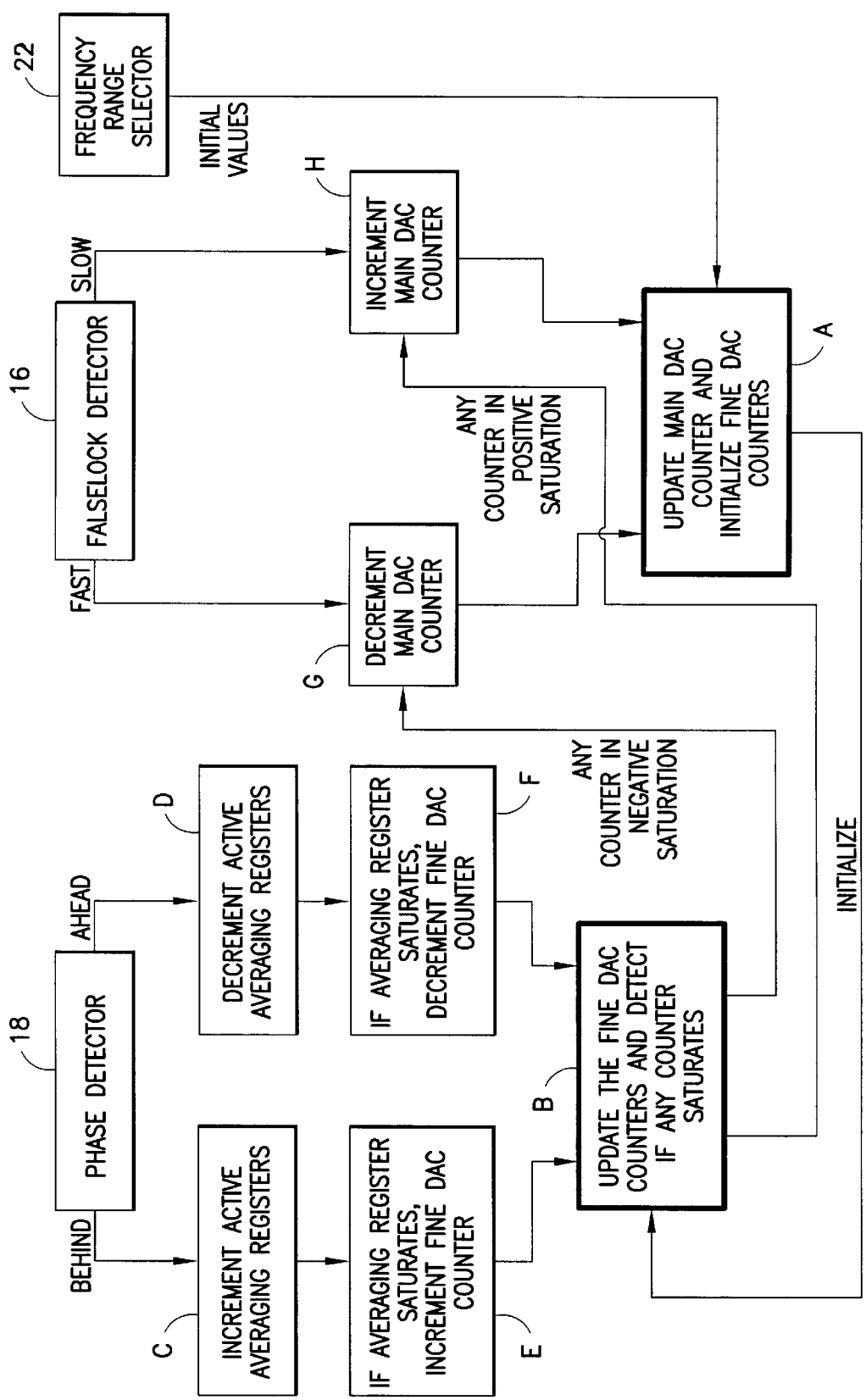
FIG. 5B is a flow chart illustrating the operation of the delay control unit.

FIG. 5A shows the inputs and outputs of the delay control unit 14, while FIG. 5B is a flow chart that illustrates the operation of the delay control unit 14. Note in FIG. 5A that each fine delay calibration is provided with some number n of control bits, while the main DAC 24 is provided with some number m of control bits, where n can be greater than, less than or equal to m. Typically n is less than mn. Typical non-limiting values for m and n are m=8 bits to 12 bits, and n=4 bits to 8 bits.

Referring to FIG. 5B, the frequency range selector input provides initial values to block A where a digital up/down counter that drives the m main DAC outputs is updated while the N digital up/down counters that drive individual ones of the n fine DAC outputs are initialized. Control then passes to block B. During subsequent operation the input from the phase detector 18 is used for incrementing and decrementing active averaging registers (blocks C and D), depending on whether the phase detector 18 indicates that the phase relationship between $f_{ref}$ and the output of the delay elements 12A–12E currently being examined is lagging (behind) or is leading (ahead), respectively. If the averaging register overflows (saturates) in either path the fine DAC counter associated with the delay line element being examined is incremented (block E, lagging path) or is decremented (block F, leading path). The end result is to vary the bias voltage output from the corresponding fine DAC 26, to thereby calibrate the currently unused one of the delay line elements 12A–12E so as to equalize the delay through each delay element so that they all exhibit the same delay. The input from the false lock detector 16, indicating whether the loop is running fast or slow, is used for decrementing (block G) or incrementing (block H) the main DAC counter. The result is to vary the bias voltage output from the main DAC 24 so as to realign the clock edges (see FIGS. 6A and 6B) to break the false lock condition. When updating the fine DAC counters at block B a check is made to determine if any one of the fine DAC counters has saturated (negative or positive). If this occurs, which can be thought of as a vernier control reaching its stop, an output is made to either block G (if the fine DAC counter is in negative saturation) or to block H (if the fine DAC counter is in positive saturation) to decrement or increment, respectively, the main DAC counter. The fine DAC counters are then again initialized to enable the fine adjustment to once more begin.

Figure 6A:
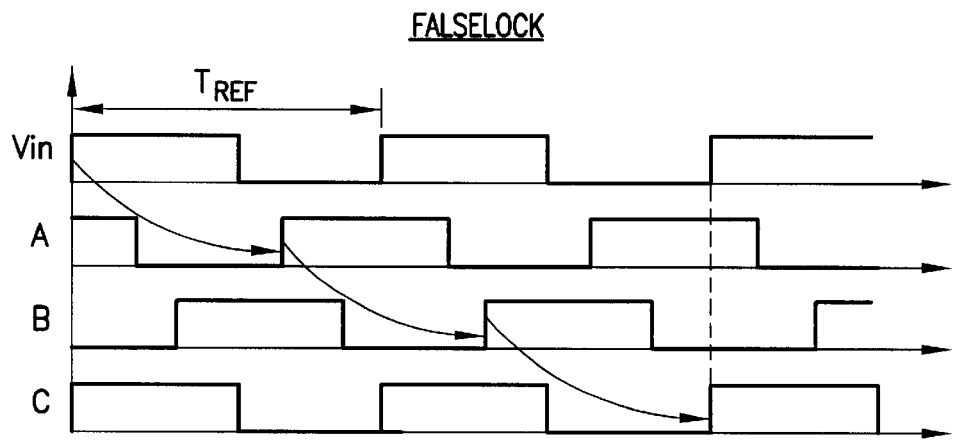
FIG. 6A shows a false lock condition that is detected by the false lock detector of FIG. 4.
Figure 6B:
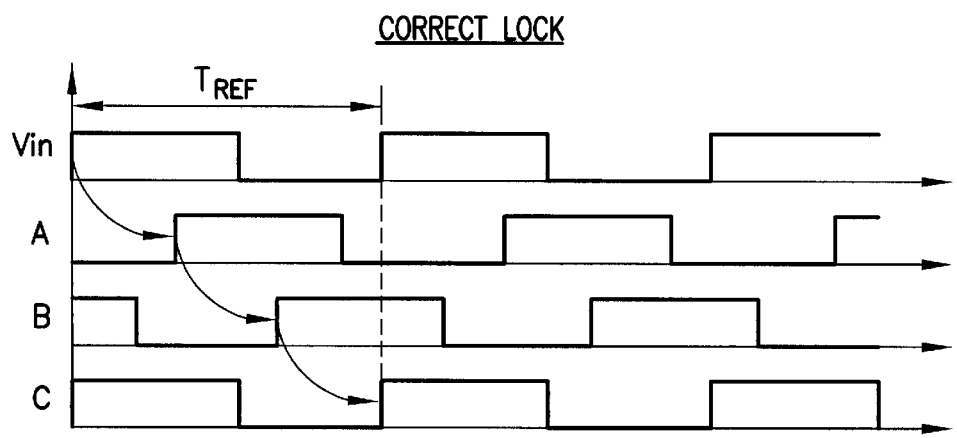
FIG. 6B shows a correct lock condition.
Figure 6C:
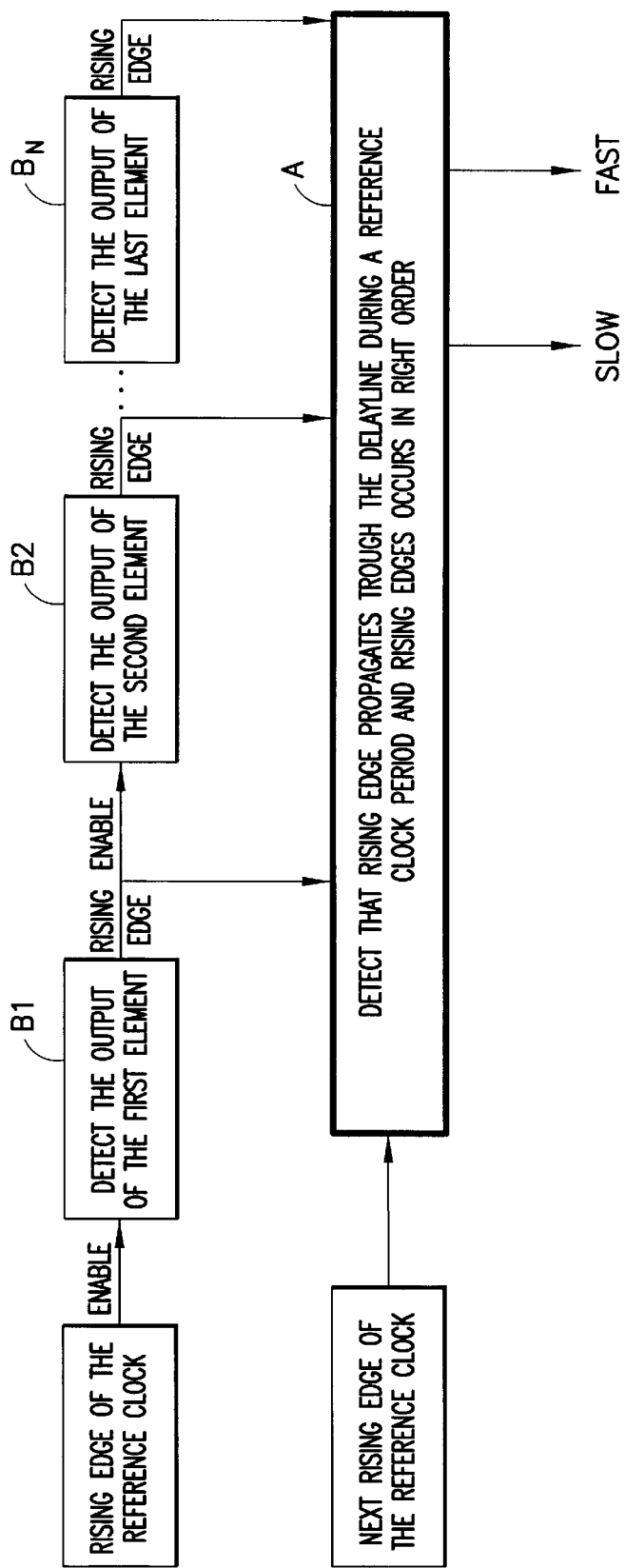
FIG. 6C is a flow chart illustrating the operation of the false lock detector.

FIG. 6A shows the false lock condition that is detected by the false lock detector 16, while FIG. 6B shows the desired correct lock condition. Note in FIG. 6B that the rising edge of the reference clock propagates through the delay line 12 during the period $T_{REF}$ of the reference clock, whereas in FIG. 6A it requires more than one reference clock period to propagate all of the edges. Note also in FIG. 6B that the edges occur in the correct sequence A followed by B followed by C. FIG. 6C is a flow chart that illustrates the operation of the false lock detector 16, and embodies the foregoing principles. In the preferred embodiment there is logic, such as a state machine, that executes block A by monitoring rising clock edges emanating from the delay line elements 12A–12E (blocks $B_1, B_2, \ldots, B_N$), and that times the occurrence of the rising edges to ensure that they occur between two consecutive rising edges of the reference clock signal, where these two consecutive rising edges defining the period of $T_{REF}$.

Figure 7A:
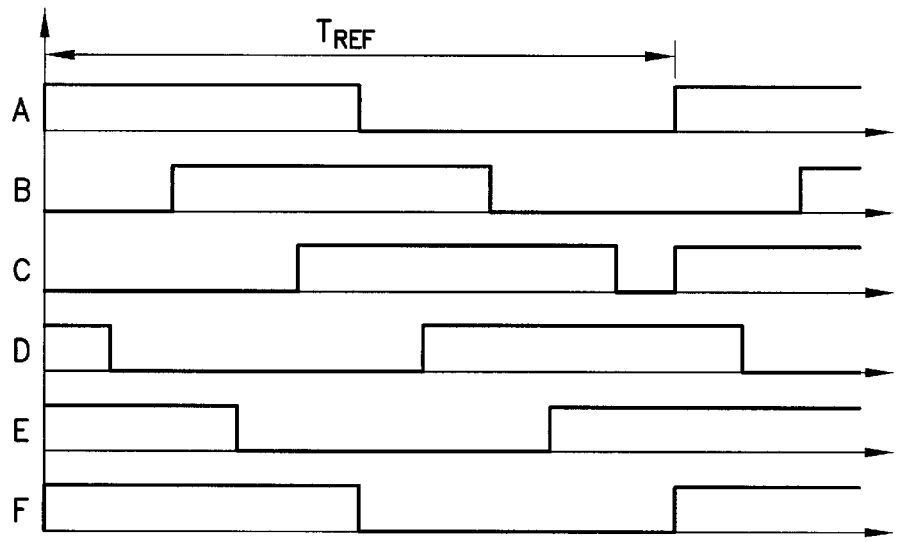
FIGS. 7A, 7B and 7C are waveform diagrams that illustrate the operation of the output decoding block of FIG. 4, where
Figure 7B:
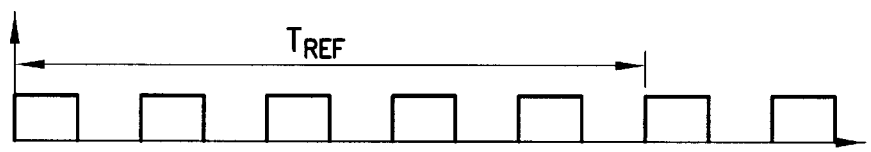
Figure 7C:
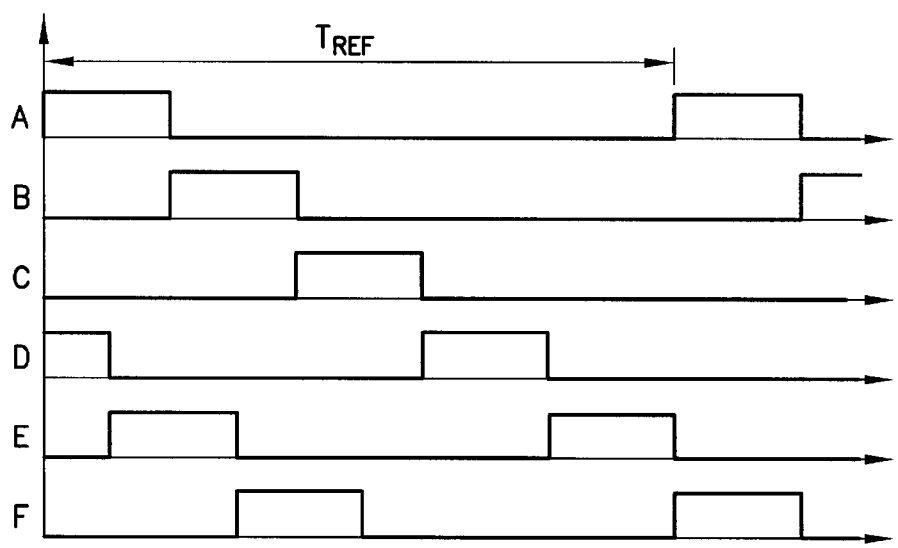

FIGS. 7A, 7B and 7C are waveform diagrams that illustrate the operation of the output decoding block 34. FIG. 7A shows the basic output waveform with overlapped outputs from the delay line elements 12A–12E. FIG. 7B shows a multiplied version of the reference frequency signal wherein five output clock pulses of $CLK_{OUT}$ occur within the period of $T_{REF}$, and FIG. 7C shows a case of non-overlapped outputs from the delay line elements 12A–12E. The output decoding block 34 may be implemented using combinatorial logic and/or RS flip-flops to trigger the outputs to be a logic one or zero. One may programmatically select between these various cases, or would may select one desired case when designing the logic.

Figure 8A:
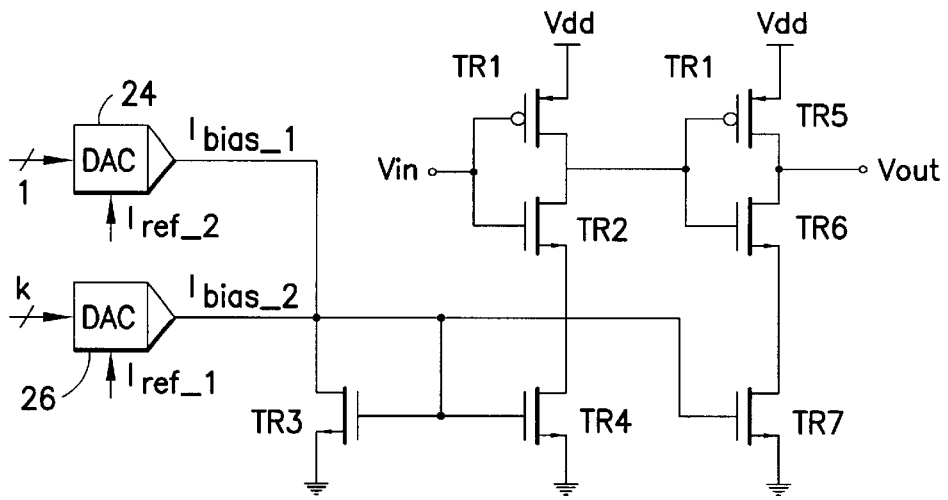

FIG. 8A illustrates an embodiment of a non-inverting delay line element, e.g., element 12A, constructed with transistors TR1 and TR2 connected as a digital inverter (a logical one input results in a logical zero output, and vice versa). This Figure shows the application of the outputs of the main DAC 24 and the fine DAC 26 to one delay line element, for example element 12A, as a bias signal for electrically controlling the delay of a signal propagating through the inverter. The DAC current outputs are shown for convenience as being summed together at the input of a current mirror formed by TR3 and TR4. TR4 forms a current source for the inverter transistors TR1 and TR2. By changing the DAC output current the current through the inverter is varied, thereby affecting the delay between the application of $V_{in}$ and the output of $V_{OUT}$. DACs 24 and 26 each have, in the illustrated embodiment, a current reference input $I_{ref}$. In general, a delay element in this invention is considered to be an element that delays the signal but does not change the polarity of the signal. Thus, in FIG. 8A the delay element 12 is constructed using two cascaded inverters. TR1 and TR2 form one inverter and TR5 and TR6 another. TR4 and TR7 mirror the current of TR3 to the two inverters. However, in other embodiments of this invention the delay line could be constructed using delay line elements that invert the signal applied to their respective inputs, or it could be constructed using a both inverting and non-inverting delay line elements 12, depending on the needs of the application.

Note that in general the Figures have depicted, for simplicity, the delay elements 12 as single-ended devices. However, integrated circuit operation normally requires the use of differential structures, such as differential pairs. One such differential pair, utilizing MOS loads, can be found in FIG. 8E.

Figure 8B:
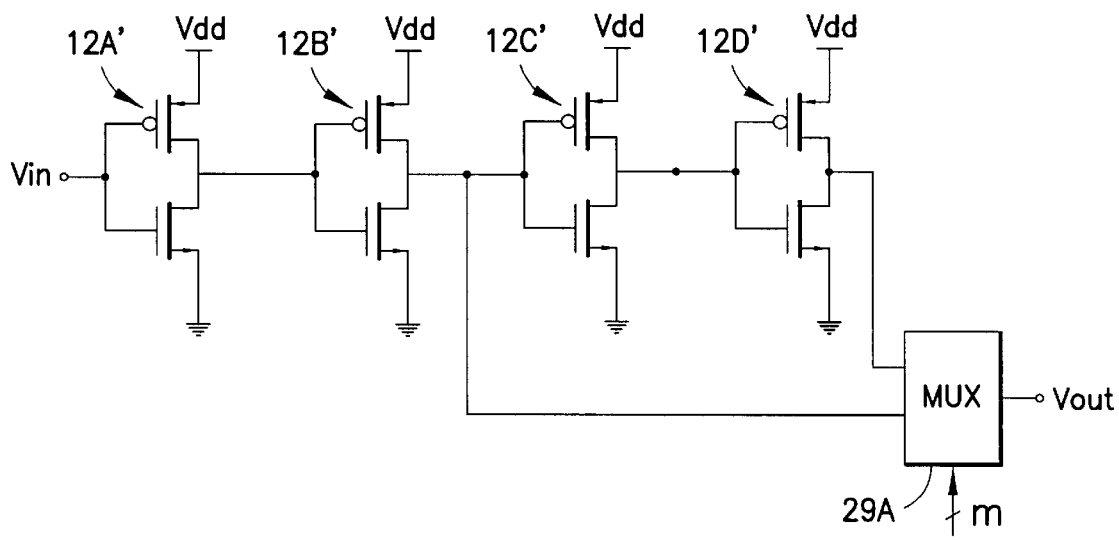
Figure 8C:
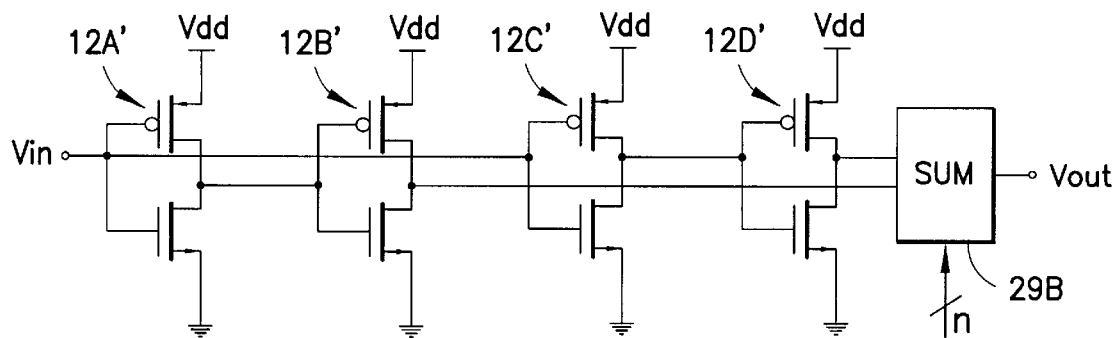
Figure 8E:
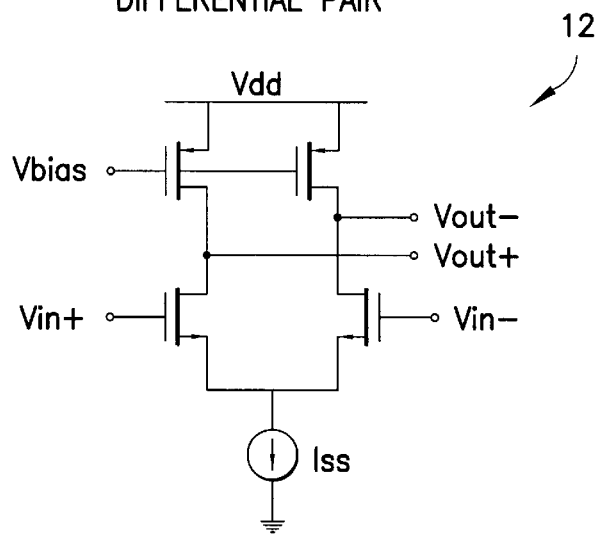
FIG. 8E shows a differential pair embodiment for a delay element.

FIG. 8B shows an exemplary case of four delay line sub-elements 12A'–12D' connected in a cascaded inverter embodiment with their respective outputs connected to inputs of a selector, embodied in this case as a MUX 29A. FIG. 8C shows the exemplary four delay line sub-elements 12A'–12D' in a paralleled inverter embodiment with their outputs connected to a combiner 29B. In FIGS. 8B and 8C the bias inputs are not shown in order to simplify the drawings. In general, the MUX 29A selects one from several inputs to be connected to its output, while the combiner 29B combines the outputs of the delay element slice in parallel, and sums their outputs together. Both procedures are capable of making an adjustment to the total delay through the delay line element 12 that is comprised of the sub-elements 12A'–12D'.

Figure 9:
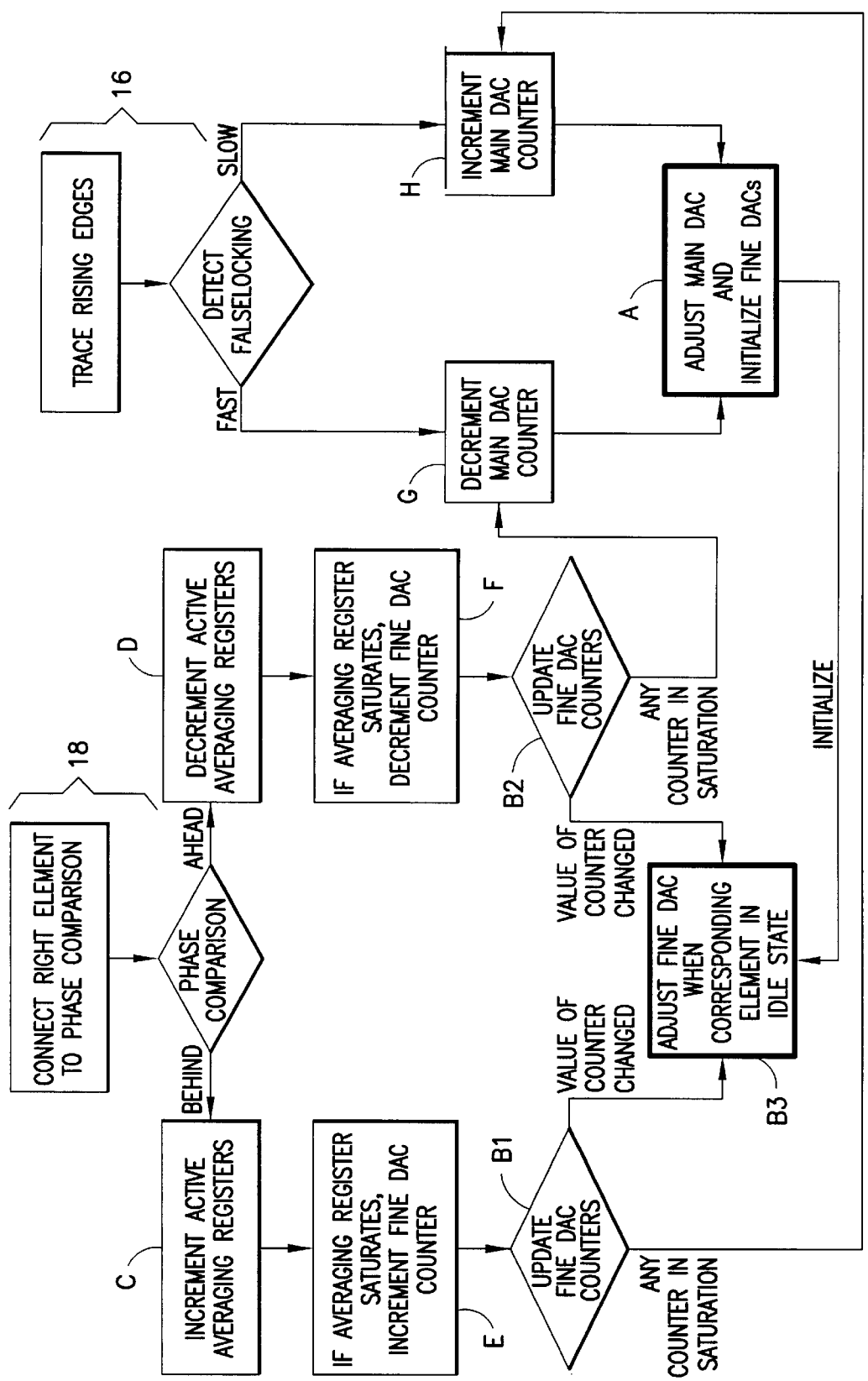
FIG. 9 is a flowchart illustrating the overall calibration procedure.

FIG. 9 is a flowchart illustrating the overall calibration procedure. FIG. 9 is similar in some respects to the flowchart of FIG. 5B, and like functioning blocks are indicated by the same designations. Note that block B is shown partitioned into blocks B1, B2 and B3, where in B1 and B2 the fine DAC 26 counters are updated by being incremented or decremented for the lagging and leading cases, respectively, and where at block B3 the corresponding delay element 12A–12E is bias adjusted when in the idle state.

Referring again to FIG. 4, at the start of the calibration operation the upper input (u) of MUX 28A is selected so that the reference clock $f_{ref}$ is applied to the first delay element 12A, the center (c) and lower (l) inputs are disabled. The lower input (l) of MUX 28E is set to zero, and the center input of each of MUXes 28B–28D are selected. For the next reference clock period the MUX control unit 32 changes the MUX control lines so that the upper input (u) of MUX 28B is selected so that the reference clock $f_{ref}$ is applied to the second delay element 12B while the center inputs of MUXes 28A, 28B and 28C are selected. The result is that the output of delay element 12E is re-circulated back through the center input of MUX 28A to drive the first delay element 12A. This process continues until all of the delay elements 12A–12E have been corrected once, and the calibration begins again.

Figure 10A:
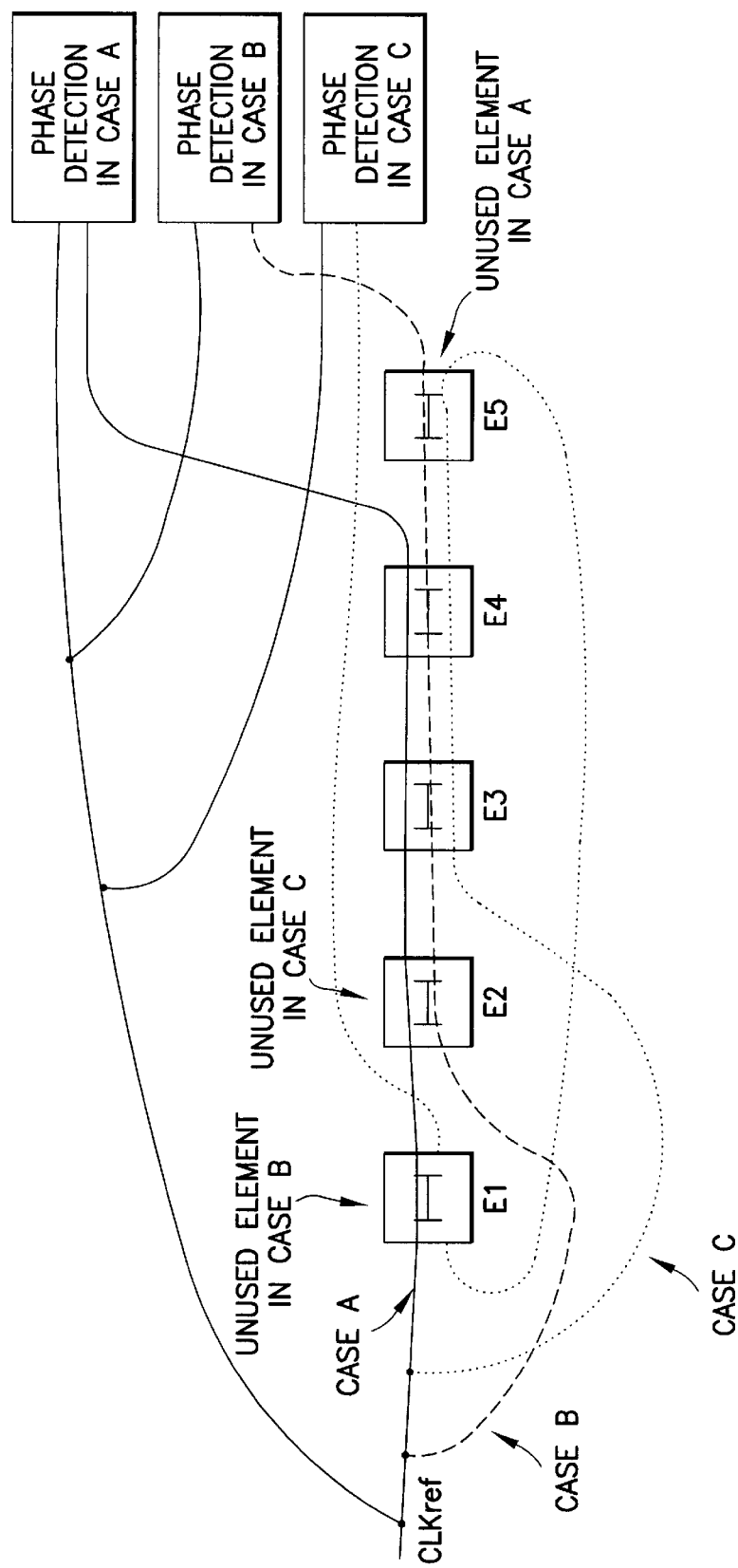

Reference is made to FIGS. 10A and 10B for showing the propagation of the unused delay element 12 and the inputs to the phase detector 18 for various calibration Cases A–E (only Cases A–C are shown to simplify the drawing). As an example, in Case A the delay element E5 is the unused element, in Case B the delay element E1 is the unused element, and so forth. The averaging registers that form a part of the delay control unit 14 are used to attenuate the oscillation of the delay about the correct value. Note that the value of the adjustment is not corrected after every phase detection, but only if there is some number (e.g., three) phase detections in the same direction (i.e., three consecutive phase detections with the same sign, plus or minus). This technique functions somewhat as a filter to prevent an excessive number of small variations in the delayed signal edges. The "averaging factor" in FIG. 10B (shown as two simply as an example) describes how many phase corrections should occur before the adjustment is corrected. The DAC counters (the inputs to the DACs 24, 26) are incremented or decremented when the averaging register associated with the unused delay element 12 is in saturation.

Figure 1A:
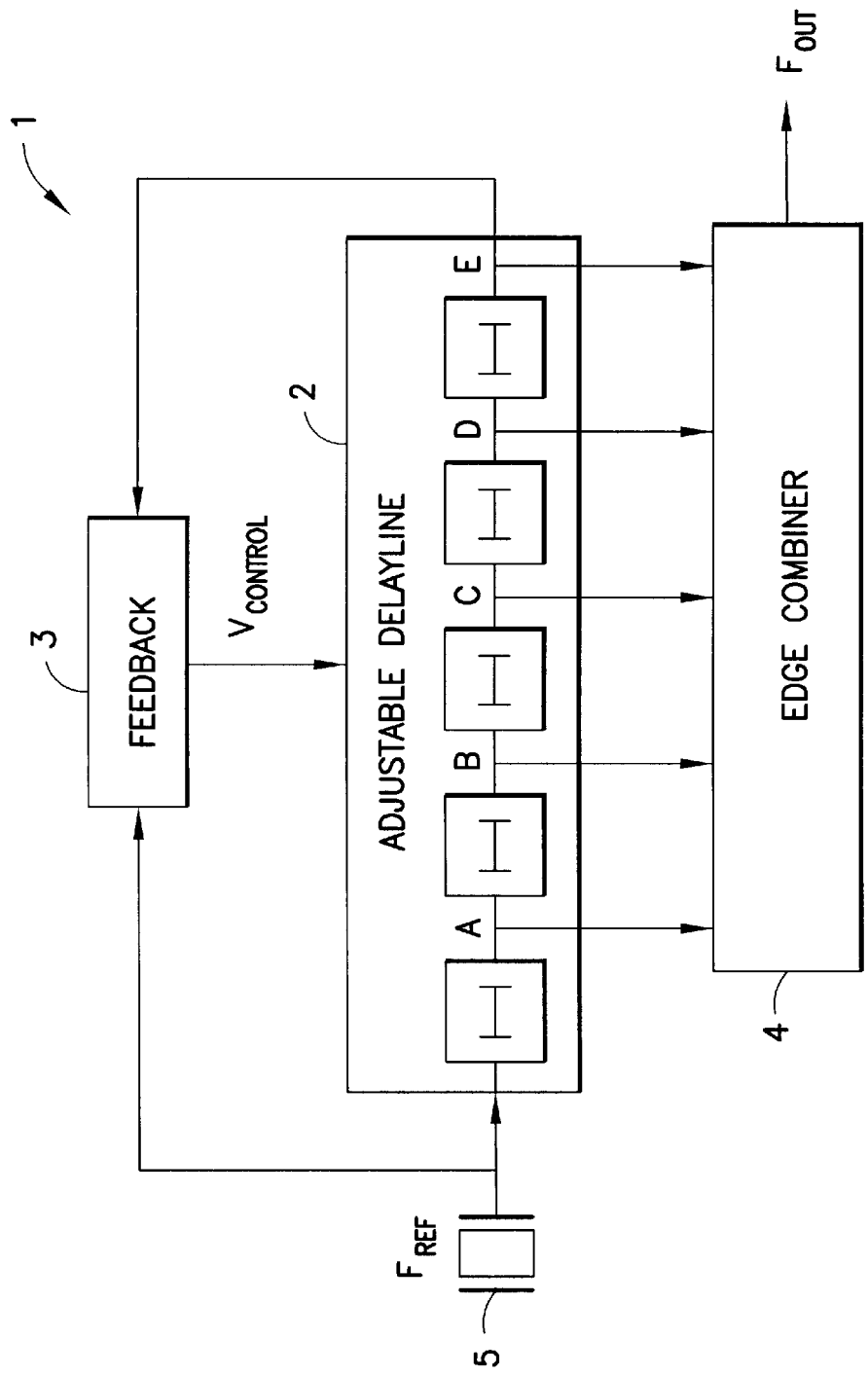
FIG. 1 is a block diagram that illustrates the basic architecture and function of a DLL.
Figure 1B:
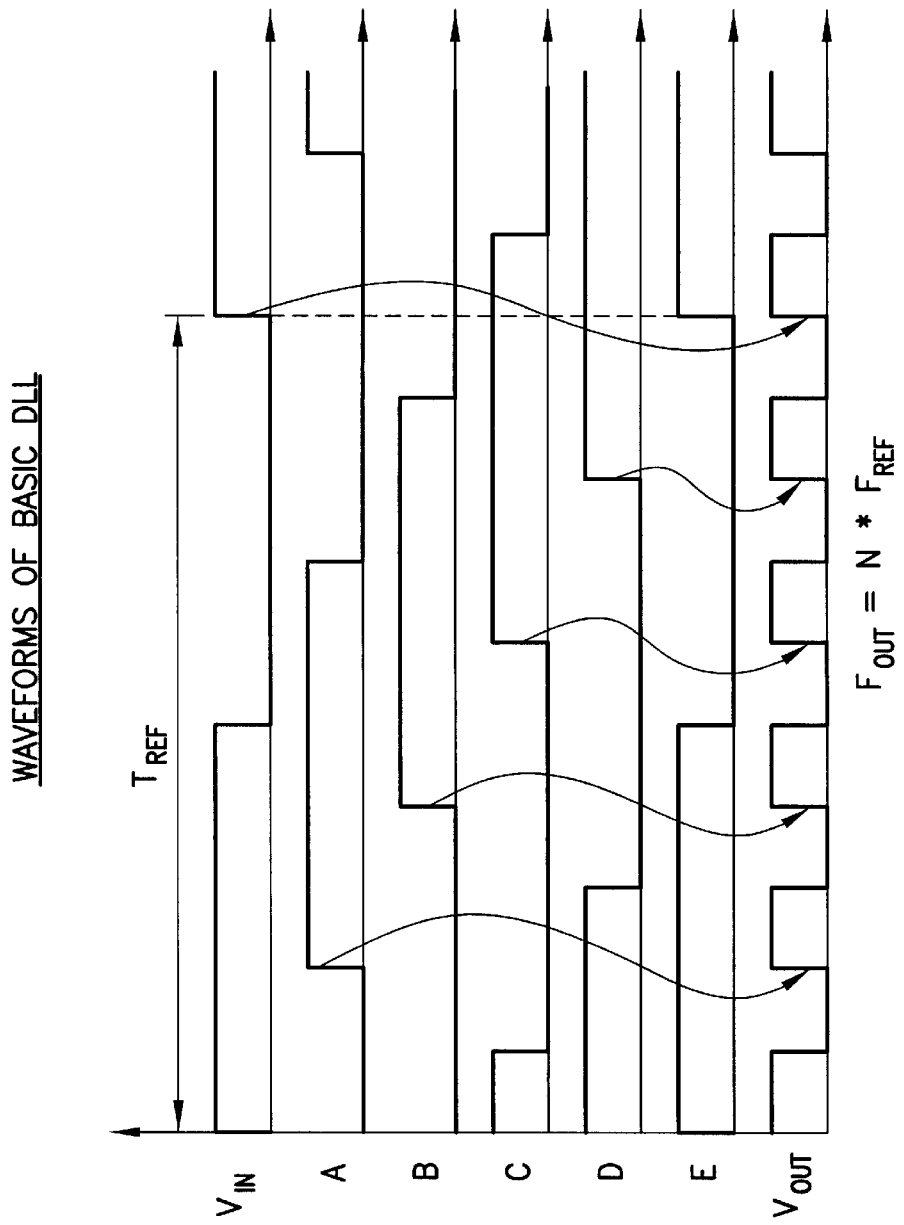
Figure 2:
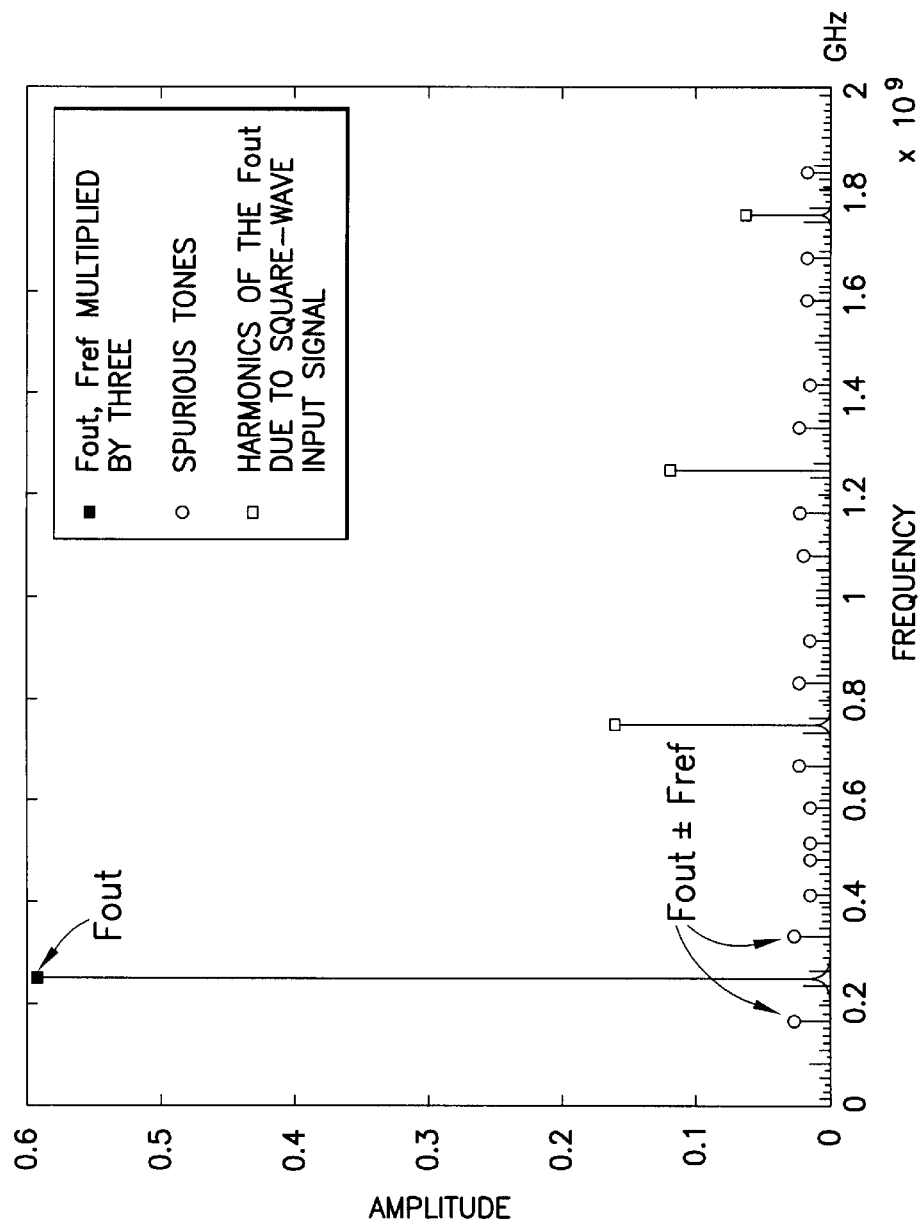
FIG. 2 illustrates the spectrum of the clock, multiplied by three, without mismatch calibration.
Figure 3:
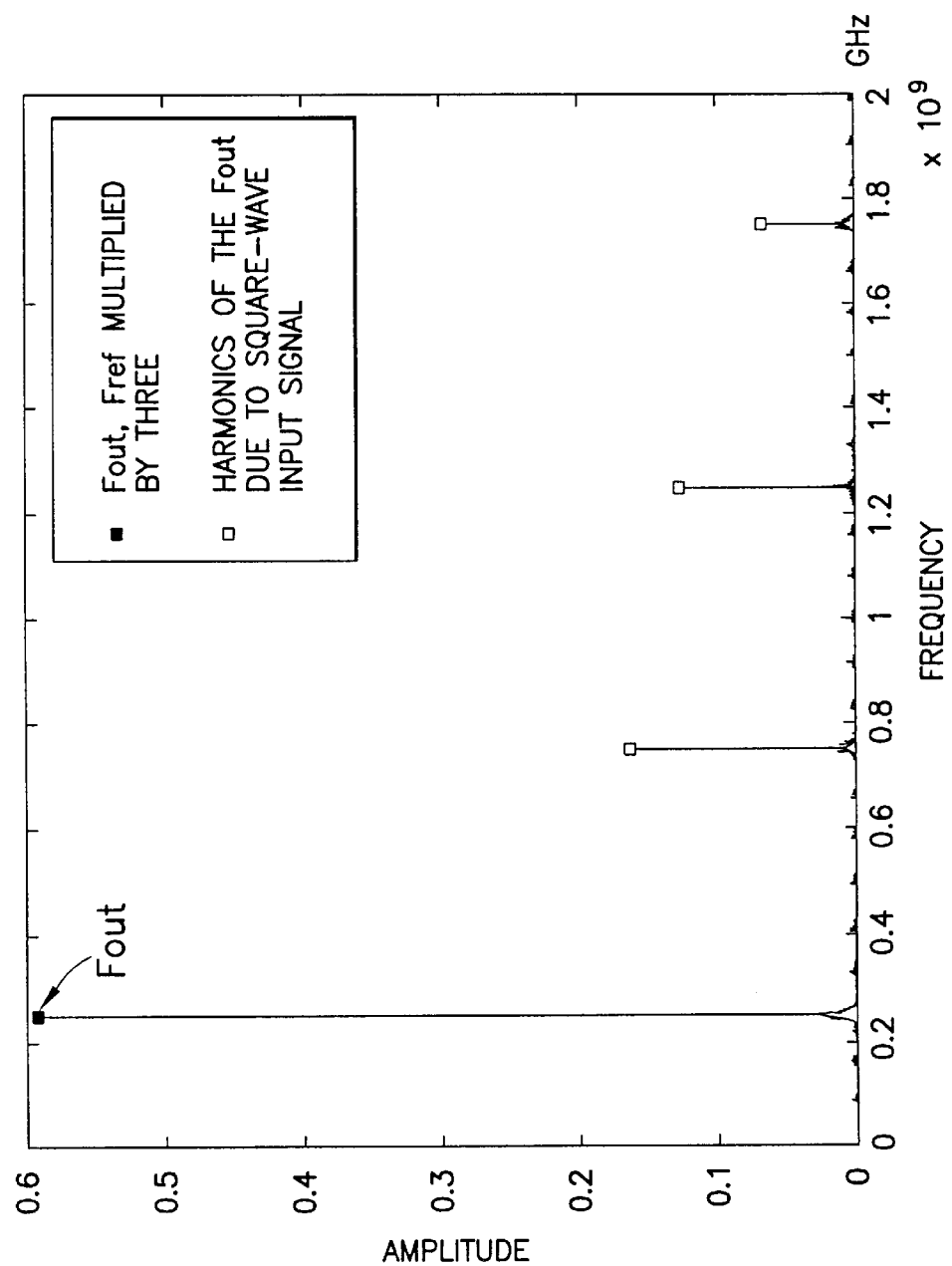
FIG. 3 illustrates the spectrum of the clock, multiplied by three, with mismatch calibration in accordance with this invention.

FIG. 3 shows the spectrum of the clock signal $CLK_{OUT}$, multiplied by three, with the delay element 12A mismatch being calibrated in accordance with this invention. The clock frequency of about 300 MHz is exemplary, and is not be construed in a limiting sense. Note the higher order harmonics that are generated as a result of the use of square wave signals. The harmonics are, however, spaced away from what would be a typical signal band of interest, and thus do not represent a significant noise source. Note that the spurious tones are eliminated, in particular the spurious tones that occur at a frequency that is $F_{ref}$ away from the output frequency $F_{OUT}$, and that may fall within the signal band of interest.

As but one example, this invention can be implemented in a low-voltage deep submicron digital CMOS process. The digital portions of the DLL 10 may be synthesized, and any analog portions designed as full custom circuitry. The additional digital blocks used to calibrate the DLL 10 may be synthesized using the deep sub-micron CMOS process in a cost and area efficient manner.

While described in the context of presently preferred embodiments, it should be realized that this invention is not limited to only these embodiments. For example, the disclosed numbers of delay line elements and the disclosed clock frequencies are provided as suitable examples of the use of this invention, and are not to be read in a limiting sense upon the practice of this invention.

Further by example, the delay adjustment is not restricted to the unused element 12, as the adjustment can be made to the used elements after the phase detection, i.e,.as the signal propagates through elements E1–E4, these elements can be adjusted immediately. This technique may be referred to as "immediate calibration", as shown in FIG. 11A.

As a further modification to the preferred embodiments, the adjustments may be stored in a memory and performed when the delay element 12 is unused. The rationale for this approach is to disturb signal as little as possible, and in this case the signal is not disturbed during propagation. The adjustment of delays is performed only when the delay element 12 is unused, and the adjustment is averaged. This technique may be referred to as "cyclic calibration", and is illustrated in FIG. 11B.

It is also within the scope of this invention to increase the averaging of the adjustment such that adjustments are made to the unused delay element 12 only if the averaging results in a desired value. This ensures that the delay of the element 12 needs to be corrected, and is thus not preferred for use in the case when the adjustment values simply oscillate about the correct delay value. This technique can be referred to as "averaged cyclic calibration", and is shown in FIG. 11C. The case described above in reference to FIG. 10B is an example of averaged cyclic calibration, with an averaging factor of two. If the averaging factor were made to be unity, the technique would revert to basic cyclic calibration as shown in FIG. 11B.

It is further important to note that the teachings of this invention encompass a wide variety of digital adjustment methods, and not just the presently preferred bias current adjustment using the DACs 24 and 26. These other methods include the techniques shown in FIGS. 8B, 8C and 8D.

Figure 8D:
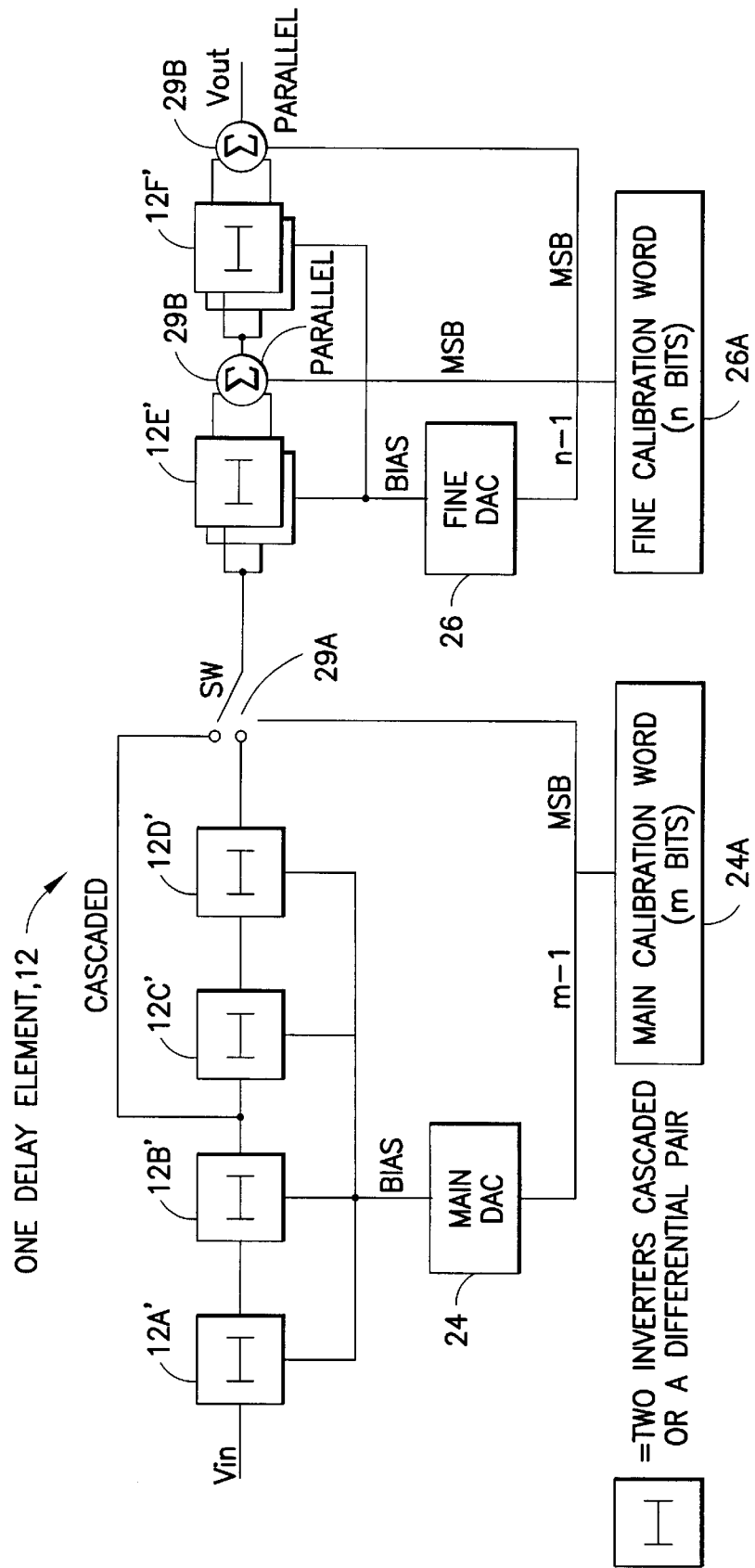
FIG. 8D illustrates a wide range delay line element using the three adjustment methods, where in more detail

FIG. 8D illustrates a wide range delay line calibration embodiment of this invention that employs cascaded, parallel and bias delay adjustments. A single main DAC 24 and a single fine DAC 26 are employed, where the main DAC 24 controls the delays through delay element sub-elements 12A'–12D', and where the fine DAC 26 controls the delays through delay sub-element paralleled slices 12E' and 12F'. An m-bit main calibration word register 24A and an n-bit fine calibration word register 26A, which could be averaging registers or memory locations contained in delay control unit 14, drive the main and fine DACs 24 and 26, respectively. A two position switch SW, which functions as the MUX 29A in FIG. 8B, is controlled by the state of the MSB of the main calibration word 24A to selectively couple the output of delay sub-element 12B' or the output of delay sub-element 12D' to the input of delay sub-element 12E'. This provides for the desired cascaded delay adjustment (see FIG. 8B). The MSB of the fine calibration word 24B controls summing junctions 29B at the outputs of delay sub-elements 12E' and 12F', respectively, to vary the number of selected paralleled delay sub-element slices (see FIG. 8C). Using this technique the electrical bias, cascaded and paralleled embodiments of delay element control can all be used in one delay line element 12.

While shown as using a single MSB bit of the main and fine calibration words, in other embodiments either or both control techniques could use the two MSBs, or three MSBs, etc., to provide further control. For example, the use of two MSBs of the main calibration word, and a four position switch SW, enables additional selection over the number of cascaded delay lines sub-elements, while the use of two MSBs of the fine calibration word enables the outputs of more sub-element slices to be selectively paralleled together (see FIG. 8C). In general, as the current drive of a delay line element 12 is increased, such as by paralleling the outputs of more sub-element slices, the signal delay decreases.

It should be noted that in addition to the foregoing techniques for electrically configuring the delay line elements to vary their delay, it is also within the scope of this invention vary a load capacitance seen by a delay element. For example, as the load capacitance increases the overall signal delay increases, and vice versa.

Based on the foregoing description, it should be apparent that an aspect of this invention is the operation and calibration of a DLL that employs, for example, the use four delay line elements out of five in a rotating manner for generating delays, with one delay line element being a currently "unused" delay element. During the calibration process the starting and ending points of the chain of delay line elements are rotated. For each rotation "position" a phase detection is made. This enables the calibration of all of the delay line elements. Each phase detection provides some information concerning all of the currently used delay line elements that were involved in generating the current delay. The result of a phase detection can be used in a plurality of ways (e.g., immediate, cyclic and averaged cyclic) in order to adjust the delays of the delay line elements 12. A phase detection result can be used to change the delay of those elements (the "used elements") that were in the delay line "immediately". In another embodiment one may store or save the phase detection result information to a memory associated with each delay line element, and then use the information later together with information obtained from other phase detections (in the "cyclic" and "averaged cyclic" approaches) to calibrate the unused delay line elements. After repeating the rotating and calibrating operations over some number (e.g., tens) of cycles all of the delay line elements become calibrated. The calibration procedure may then be stopped, or it may be continued in order to track, for example, temperature and/or power supply voltage variations.

It should be apparent that this invention may take a number of forms and manifestations, and that all such forms and manifestations are deemed to be within the scope of this invention.

What is claimed is:

1. A method for calibrating a delay-locked loop comprising a chain of delay line elements that propagate a reference clock from delay line element to delay line element, comprising:

during a calibration procedure, sequentially varying the configuration of the chain of delay line elements so that there is one unused delay line element and a plurality of used delay line elements; and for each configuration, electrically compensating at least one delay line element based on a phase comparison made between the reference clock and the propagated reference clock so as to set the total delay through the chain of delay line elements at a desired value.

2. A method as in claim 1, where sequentially varying the configuration comprises cyclically changing the start and the end of the chain of delay line elements.

3. A method as in claim 1, where the step of electrically compensating is an immediate compensation that occurs after each phase comparison and electrically compensates all of the used delay line elements.

4. A method as in claim 1, where the step of electrically compensating is a cyclic compensation that occurs after each phase comparison and that electrically compensates the currently unused delay line element that was used in a plurality of previous configurations.

5. A method as in claim 1, where the step of electrically compensating is an averaged cyclic compensation that occurs after a plurality of phase comparisons and that electrically compensates the currently unused delay line element based on a history obtained over a plurality of previous configurations.

6. A method as in claim 1, where electrically compensating comprises varying a bias voltage to at least one delay line element.

7. A method as in claim 1, where electrically compensating comprises electrically configuring at least one delay element.

8. A method as in claim 7, where electrically configuring comprises varying a number of cascaded delay element sub-elements.

9. A method as in claim 7, where electrically configuring comprises varying a number of paralleled delay element sub-elements.

10. A method as in claim 7, where electrically configuring comprises varying a load capacitance seen by at least one delay element.

11. A method as in claim 1, where electrically compensating comprises setting a common adjustment to all delay line elements, and setting individual adjustments to each of the delay line elements.

12. A method as in claim 6, where varying a bias voltage comprises setting the inputs to a plurality of DACs, including a main DAC that outputs a common bias signal to all of the delay line elements and, for each delay line element, a fine DAC.

13. A method as in claim 1, where electrically compensating comprises detecting a false delay line lock condition, and adjusting the delay to achieve a true delay line lock.

14. A method as in claim 13, where detecting a false delay line lock condition comprises determining that delay line element outputs appear in a desired order and occur within one period of the reference clock.

15. A delay-locked loop comprising a chain of delay line elements that propagate a reference clock from delay line element to delay line element, further comprising calibration circuitry operable, during a calibration procedure, to sequentially vary the configuration of the chain of delay line elements so that there is one unused delay line element and a plurality of used delay line elements; and for each configuration, circuitry for electrically compensating at least one delay line element based on a phase comparison between the reference clock and the propagated reference clock so as to set the total delay through the chain of delay line elements at a desired value.

16. A delay-locked loop as in claim 15, where said calibration circuitry performs an immediate compensation that occurs after each phase comparison and electrically compensates all of the used delay line elements.

17. A delay-locked loop as in claim 15, where said calibration circuitry performs a cyclic compensation that occurs after each phase comparison and that electrically compensates the currently unused delay line element that was used in a plurality of previous configurations.

18. A delay-locked loop as in claim 15, where said calibration circuitry performs an averaged cyclic compensation that occurs after a plurality of phase comparisons and that electrically compensates the currently unused delay line element based on a history obtained over a plurality of previous configurations.

19. A delay-locked loop as in claim 15, where said calibration circuitry comprises circuitry to vary a bias voltage of at least one delay line element.

20. A delay-locked loop as in claim 15, where said calibration circuitry comprises circuitry to electrically configure at least one delay element.

21. A delay-locked loop as in claim 20, where said circuitry to electrically configure comprises circuitry to vary a number of cascaded delay element sub-elements.

22. A delay-locked loop as in claim 20, where said circuitry to electrically configure comprises circuitry to vary a number of paralleled delay element sub-elements.

23. A delay-locked loop as in claim 20, where said circuitry to electrically configure comprises circuitry to vary a load capacitance seen by a delay element.

24. A delay-locked loop as in claim 19, where said circuitry that varies the bias voltage comprises a plurality of DACs, including a main DAC that outputs a common bias signal to all of the delay line elements and, for each delay line element, a fine DAC.

25. A delay-locked loop as in claim 15, where said calibration circuitry operates to cyclically change the start and the end of the chain of delay line elements.

26. A delay-locked loop as in claim 15, where said calibration circuitry operates to set a common adjustment to all delay line elements, and to set individual adjustments to each of the delay line elements.

27. A delay-locked loop as in claim 15, where said calibration circuitry comprises circuitry to detect a false delay line lock condition, and in response to adjust the delay to achieve a true delay line lock.

28. A delay-locked loop as in claim 27, where said circuitry to detect a false delay line lock condition is coupled to outputs of said delay line elements and operates to determine that the delay line element outputs appear in a desired order and occur within one period of the reference clock.

* * * * *